May 11, 1954 C. O. JAEGER 2,678,020

VISIBLE RADIO TUNING DEVICE

Filed April 15, 1949 2 Sheets-Sheet 1

INVENTOR.
CLEMENS O. JAEGER
BY
Christian R. Nielsen
ATTORNEY.

May 11, 1954 C. O. JAEGER 2,678,020
VISIBLE RADIO TUNING DEVICE
Filed April 15, 1949 2 Sheets-Sheet 2

INVENTOR.
CLEMENS O. JAEGER
BY
Christian R. Nielsen
ATTORNEY.

Patented May 11, 1954 2,678,020

UNITED STATES PATENT OFFICE 2,678,020

VISIBLE RADIO TUNING DEVICE

Clemens O. Jaeger, Milwaukee, Wis.

Application April 15, 1949, Serial No. 87,793

5 Claims. (Cl. 116—124.2)

My invention relates to radio tuning devices and more particularly to an adjustable tuning device for selecting predetermined stations.

The object of my invention is to provide a device that is constructed in a manner to permit the quick and positive selection for tuning in certain predetermined radio stations.

Another object of my invention is to provide a device that is equipped with a selector notch moved by the tuning shaft for engagement of the station selectors thereby enabling the operator to tune in on any predetermined radio station.

Still another object of my invention is to provide visible identification of the pre-selected stations to enable the operator to make his proper selection.

A further object of my invention is to provide a means of the character described which may be readily installed into any type of radio receiving instrument.

A still further object of my invention is to provide a device of the character described that does not interfere with the tuning of the receiving set to any station having a frequency or wave length indicated on any place on the dial.

It is manifest to anyone familiar with the manipulations of a radio receiving set, that the operator must first turn the tuning shaft by means of the tuning knob until the approximate wave length or frequency of the desired station is obtained and by back and forth oscillatory motion of the tuning knob, until the quality and volume and the best audibility is obtained. The device described herein permits the quick and positive tuning in of a plurality of stations one at a time, and permits the selectors to be securely fastened at the proper position for each station so that any one of these stations selected by the operator can be quickly, clearly and audibly tuned in by means of the indicator.

The device is simple in construction and may be designed to be installed into most any type of radio receiving instrument.

Other and further objects of my invention will become more apparent as the description proceeds when taken in conjunction with the drawings in which Figure 1 is a fragmentary front view of a radial type of tuning device with the mask and tuning knob removed.

Figure 1:
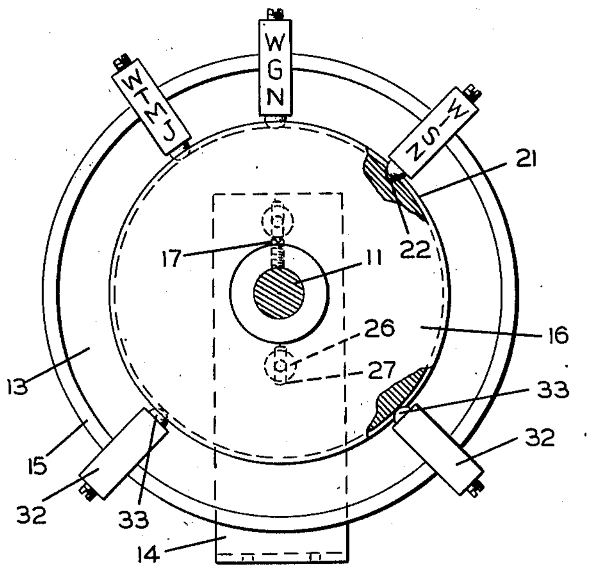

Similar characters of reference indicate corresponding parts throughout the several views and referring now to the same, the character 11 shows a tuning shaft equipped with a control knob 12, used for revolving the shaft 11 in making the selection. There is a circular member 13 shown attached to a vertical standard 14, and this circular member 13 has a flange 15 extending outward at right angles thereto, and a rotor 16 is mounted on the shaft 11 and is centrally disposed within the member 13.

The rotor 16 is in the form of a circular member and is shown attached to the shaft 11 by means of a set screw 17.

The control knob 12 is attached to the end of the shaft 11 by means of the set screw 18. Disposed between the outward extending hub of the rotor 16 and the knob 12, and held in fixed engagement with the rotor 16, is shown a circular mask 19 which is provided with an elongated aperture 20. The entire outer periphery of the rotor 16 is provided with a semi-radial groove 21 equipped with a single depression disposed within the bottom thereof and this depression is shown as 22 in the drawing.

Figure 3:
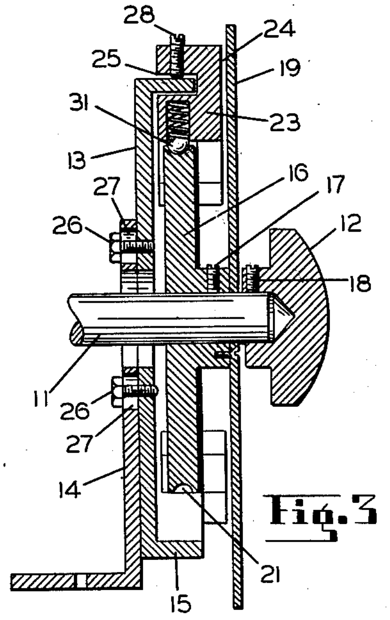
Figure 3 is a cross-sectional view of the radio tuning device taken at the line 3—3 in Figure 2.
Figures 2, 4, 5:
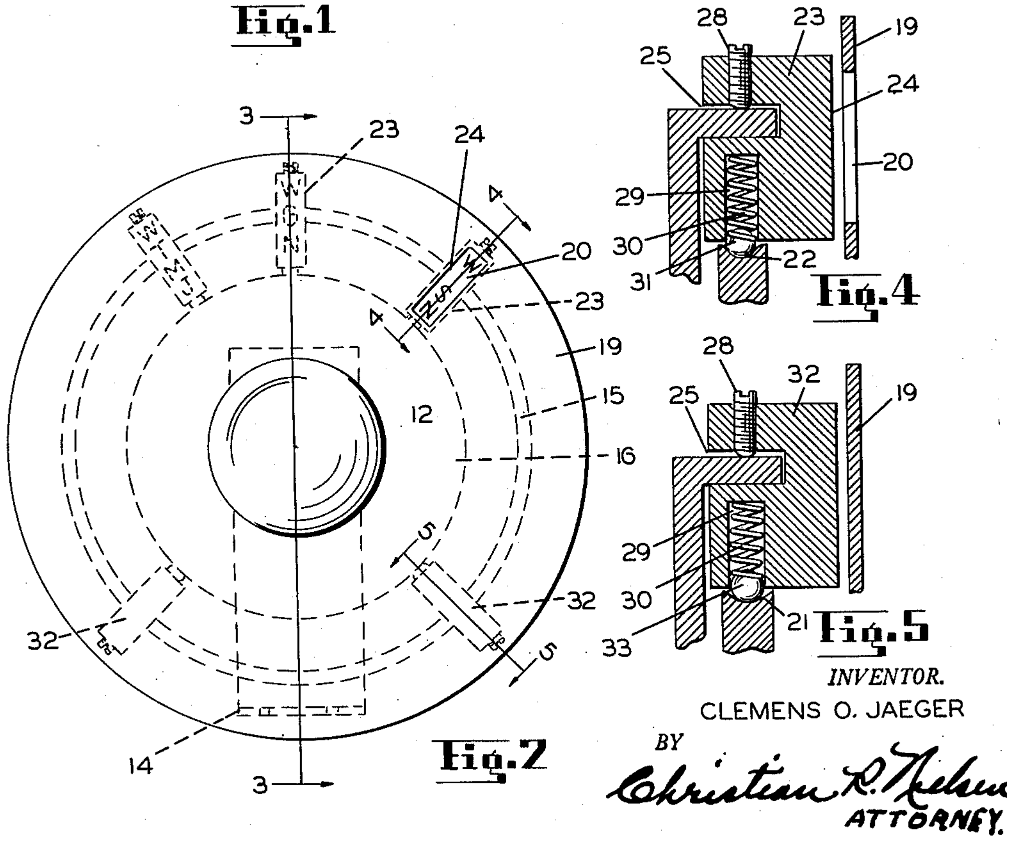
Figure 2 is a front view of the device as shown in Figure 1 with the tuning knob and the mask in position.
Figure 4 is a fragmentary cross-section through the selector, taken at the line 4—4 in Figure 2.
Figure 5 is a fragmentary cross-sectional view through a balance support, taken at the line 5—5 in Figure 2.

The outwardly extending flange 15 on the outer edge of the member 13 in Figures 1, 2 and 3, supports a plurality of station selectors 23, having a flat front face 24 onto which the station identification is inscribed. The selector 23 has an inwardly disposed open slot 25 of a dimension to accommodate the flange 15 of the stationary member 13, which is shown attached to the vertical standard 14 by means of screws 26 slidably engaging the member 13 and extending through open slots 27 in the standard 14.

There are set screws 28 threadedly engaging the selector 23, for contact with the outer peripheral surface of the flange 15, and the lower portion of the selector 23 has an inwardly extending aperture 29 into which a resilient member in the form of a coil spring 30 is disposed and each of the selectors 23 are provided with a spherical member 31 urged into the semi-radial groove 21 on the outer peripheral surface of the rotor 16 and revolving as the rotor 16 is revolved.

On the lower portion of the flange 15 of the member 13 are shown a pair of balancers 32 constructed similar to the station selector 23 but equipped with spherical balls 33 of a larger diameter than the spherical members 31 in the selector 23, inasmuch as the balls 33 engage only the semi-radial groove 21 on the rotor 16, while the smaller ball 31 while permitting to rotate within the groove 21 will engage with the single depression 22 in the face of the groove 21.

Figures 6, 7, 8, 9, 10:
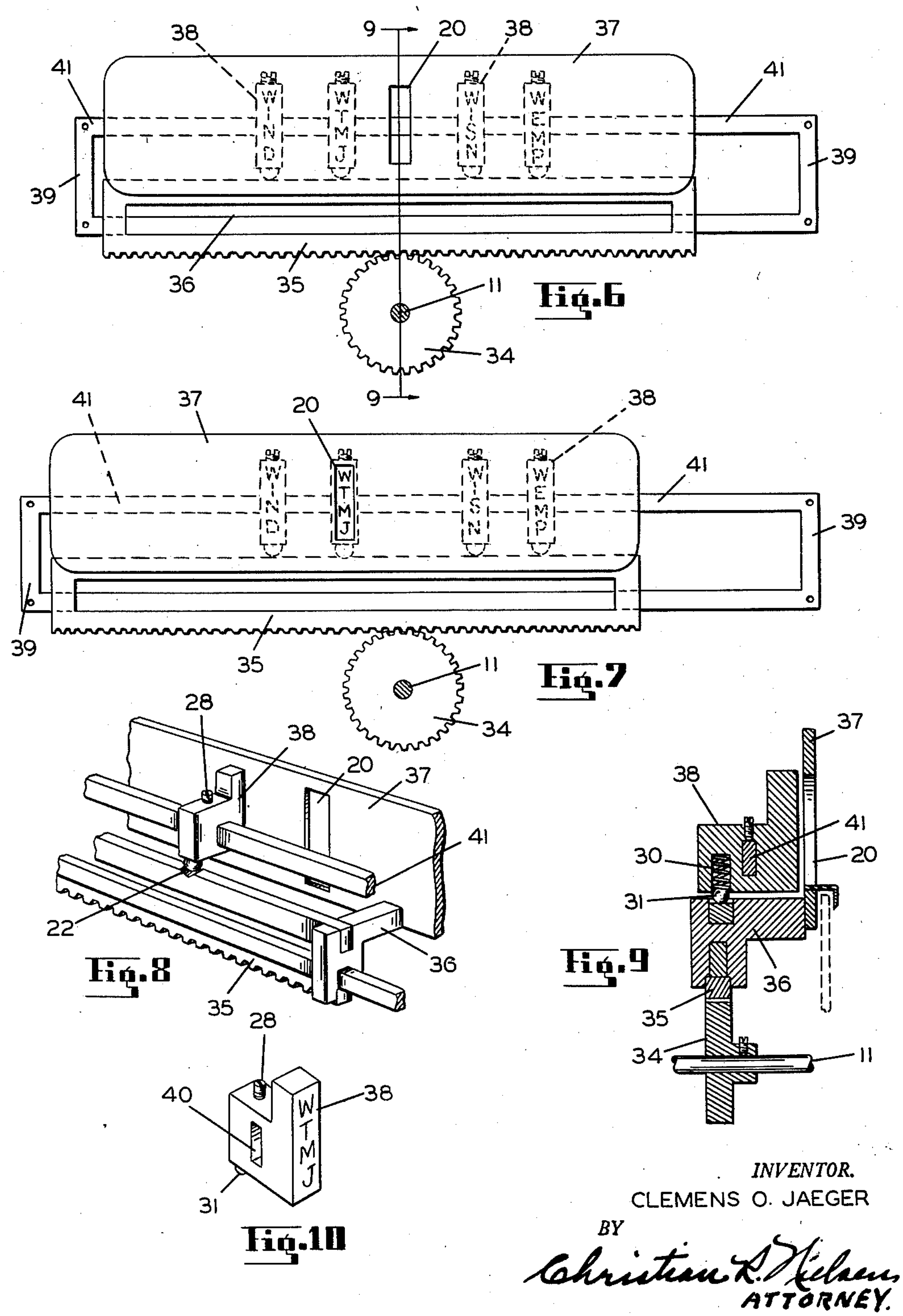
Figure 6 is a front view of the device in a modified form, which is longitudinally disposed with the mask in a neutral position.
Figure 7 is a similar view of the device as shown in Figure 6 with the mask in a select position.
Figure 8 is a fragmentary perspective rear view of the modified longitudinal device.
Figure 9 is a cross-sectional view of the device as shown in Figure 6 taken at the line 9—9 therein.
Figure 10 is a perspective view of the selector showing the identification on its face.

Obviously the mask 19 may have an indicator (not shown) attached to the face thereof, to act as a movable guide to indicate the relation of the tuning shaft with the wave lengths scale shown in phantom in Figure 9, forming a part of the receiver assembly.

In Figure 6 to 10 inclusive, in the drawing, I show a modified construction of the device functioning and operating in the same manner but having the tuning shaft 11 equipped with a pinion 34 engaging a gear rack 35, which is a part of the carriage 36 functioning the same as the rotor 16, and which supports a longitudinal mask 37 which is equivalent to the radial mask 19. The selectors 38 are slideably supported on a horizontal frame 39, which is equivalent to the member 13 provided with the flange 15 for their engagement, except that the selectors 38 are equipped with an aperture 40 to accommodate the upper guide rail 41, of the horizontal frame 39.

To set or position a selector 23 for any desired station, the operator first tunes in the desired station by means of the usual oscillatory manipulation, then a selector with the proper station identification is slideably brought to a position, whereby the ball 31 engages the single depression 22, and the set screw 28 is then fastened thereby permanently retaining the selector in position. This same operation is repeated for as many stations as the operator would want pre-selected.

Obviously the depression 22 is always in alignment with the opening 20 in the mask thereby permitting the operator to identify the station obtained. The tuning shaft may be operated in the conventional manner for the correct frequency of other stations, the selectors in no way interfering with the tuning process of the receiving set. It is manifest that the device as described provides a means that performs efficiently for the purpose intended. It is economical to construct, and may be applied to practically any conventional radio receiver assembly and although I have shown a particular arrangement of the component parts, I am fully cognizant of the fact that many changes may be made in the form and configuration of the component parts without affecting their operativeness, and I reserve the right to make such changes as I may deem convenient without departing from the spirit of the invention or the scope of the appended claims.

Having thus described my invention, what I claim and desire to secure by Letters Patent in the United States is:

1. A tuning device of the character described to be used in connection with a radio receiver, said tuning device comprising in combination, a stationary member supported by said receiver, a plurality of selector members slideably mounted to said stationary member, said selector members being provided with station identification on their outer faces, a movable carriage member actuated by said tuning shaft in said radio receiver, said movable member equipped with a single depression on its peripheral face, a mask attached to said movable member, said mask provided with an aperture disposed therethrough for direct alignment with the station identification on the face of said selector members, said movable member mounted in parallel relation to said stationary member and resiliently actuated, engaging means on said selector member for contact with the single depression on said movable member.

2. A device of the character described adaptable for use with the tuning shaft of a radio receiving instrument, said device comprising in combination, a stationary member forming a part of the receiving set assembly, a plurality of selector members slideably mounted to said stationary member, said selector members provided with station identification on their outer faces, a movable member actuated by said tuning shaft, said movable member equipped with a single depression on its peripheral face, an opaque mask forming a part of said movable member, said mask provided with an aperture disposed therethrough for direct alignment with the station identification on the face of said selector members, said movable member mounted in parallel relation to said stationary member, said selector members being provided with resiliently actuated members arranged for engagement with the single depression on the periphery of said movable member.

3. A tuning device of the character described to be used in connection with a radio receiver having a tuning shaft, said tuning device comprising in combination a circular stationary member supported by said receiving instrument, said stationary member provided with an outwardly extending flange on its outer peripheral edge, a plurality of selectors slideably engaging the outwardly extending flange of said stationary member, said selectors provided with station identification on their outer faces, a movable rotor member actuated by said tuning shaft, said movable rotor member equipped with a single depression on its outer peripheral face, an opaque mask attached to said tuning shaft and actuated thereby, said mask provided with an aperture disposed therethrough for direct alignment with the station identification on the face of said selectors, said movable member mounted in parallel relation to said stationary member, said selectors provided with resiliently actuated members arranged for engagement with the single depression on said movable member.

4. A device of the character described adaptable for use with the tuning shaft of a radio receiving instrument, said tuning device comprising in combination a stationary member supported by said receiver, said stationary member provided with an outwardly extending flange on its outer face, a plurality of selectors slideably engaged in the outwardly extending flange of said stationary member, said selectors provided with station identification on their outer faces, a movable member actuated by said tuning shaft, said movable member equipped with a single depression on its face, a mask attached to said movable member, said mask provided with an aperture disposed therethrough for direct alignment with the station identification on the face of said selectors, said movable member mounted in parallel relation to said stationary member, engaging means on said selectors for contact with the single depression on the movable member.

5. A tuning device of the character described to be used in combination with a radio receiver having a tuning shaft extending outward therefrom, said tuning device comprising a circular stationary member supported by said receiving instrument, a plurality of selector members slideably mounted onto said stationary member, said selector members being provided with station identifications on their outer faces, a movable rotor member actuated by said tuning shaft, said movable rotor member equipped with a single depression on its outer peripheral face, an opaque mask rigidly attached to said tuning shaft and actuated thereby, said mask provided with an aperture disposed therethrough for direct alignment with the station identification on the face of said selector members, said movable member mounted in parallel relation to said stationary member, said selector members provided with resilient actuating members arranged for engagement with the single depression on the periphery of said movable member.

References Cited in the file of this patent

UNITED STATES PATENTS

| Number | Name | Date |
|---|---|---|
| 1,834,272 | Enderwood | Dec. 1, 1931 |
| 1,977,397 | Morel | Oct. 16, 1934 |
| 2,069,627 | Schwarzhaupt | Feb. 2, 1937 |
| 2,182,572 | Schnell | Dec. 5, 1939 |
| 2,184,965 | Villem | Dec. 26, 1939 |
| 2,186,099 | Cutting et al. | Jan. 9, 1940 |
| 2,310,303 | Masllorens | Feb. 9, 1943 |
| 2,381,227 | Richards | Aug. 7, 1945 |

FOREIGN PATENTS

| Number | Country | Date |
|---|---|---|
| 62,301 | Norway | Apr. 8, 1940 |